US012740218B2

(12) United States Patent
Sato et al.

(10) Patent No.: US 12,740,218 B2
(45) Date of Patent: Sep. 15, 2026

(54) STRUCTURE AND FIELD EFFECT TRANSISTOR

(71) Applicant: Murata Manufacturing Co., Ltd., Nagaokakyo (JP)

(72) Inventors: Hiroki Sato, Nagaokakyo (JP); Naruto Miyakawa, Nagaokakyo (JP); Shota Ushiba, Nagaokakyo (JP); Ayumi Shinagawa, Nagaokakyo (JP); Tomomi Nakano, Nagaokakyo (JP); Yuka Tokuda, Nagaokakyo (JP); Madoka Nishio, Nagaokakyo (JP); Shinsuke Tani, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 420 days.

(21) Appl. No.: 18/225,177

(22) Filed: Jul. 24, 2023

(65) Prior Publication Data

US 2023/0378265 A1 Nov. 23, 2023

Related U.S. Application Data

(63) Continuation of application No. PCT/JP2021/047529, filed on Dec. 22, 2021.

(30) Foreign Application Priority Data

Jan. 27, 2021 (JP) ................................ 2021-011367

(51) Int. Cl.
*H10D 30/67* (2025.01)
*H10D 30/01* (2025.01)
(Continued)

(52) U.S. Cl.
CPC .......... *H10K 10/484* (2023.02); *H10D 30/01* (2025.01); *H10D 30/031* (2025.01);
(Continued)

(58) Field of Classification Search
None
See application file for complete search history.

(56) References Cited

U.S. PATENT DOCUMENTS

2007/0065639 A1 3/2007 Iida et al.
2007/0218663 A1* 9/2007 Hao ................ H10D 64/01338 257/E29.162
(Continued)

FOREIGN PATENT DOCUMENTS

CN 107132253 A 9/2017
JP 2007087979 A 4/2007
(Continued)

OTHER PUBLICATIONS

Subrahmanyam et al. "A study of graphene decorated with metal nanoparticles" chemical physics letters 497 (2010) 70-75). (Year: 2010).*

(Continued)

*Primary Examiner* — Xiaoming Liu
(74) *Attorney, Agent, or Firm* — Keating & Bennett, LLP

(57) ABSTRACT

A field effect transistor includes a substrate, a material layer on a surface of the substrate and including a two-dimensional material or carbon nanotubes, and particles interposed between the substrate and the material layer.

20 Claims, 9 Drawing Sheets

(51) Int. Cl.

| | |
|---|---|
| ***H10D 62/10*** | (2025.01) |
| ***H10D 62/13*** | (2025.01) |
| ***H10D 62/80*** | (2025.01) |
| ***H10D 62/83*** | (2025.01) |
| ***H10D 64/20*** | (2025.01) |
| ***H10K 10/46*** | (2023.01) |
| ***H10K 85/00*** | (2023.01) |

(52) U.S. Cl.

CPC ....... *H10D 30/6757* (2025.01); *H10D 62/121* (2025.01); *H10D 62/155* (2025.01); *H10D 62/159* (2025.01); *H10D 62/8303* (2025.01); *H10D 62/882* (2025.01); *H10D 64/205* (2025.01); *H10K 85/00* (2023.02)

(56) References Cited

U.S. PATENT DOCUMENTS

| | | | | |
|---|---|---|---|---|
| 2011/0253969 | A1 | 10/2011 | Dai et al. | |
| 2012/0145998 | A1 | 6/2012 | Chen et al. | |
| 2012/0214172 | A1 | 8/2012 | Chen et al. | |
| 2014/0070170 | A1* | 3/2014 | Andersson ......... | G01N 27/4146 257/29 |
| 2016/0091447 | A1* | 3/2016 | Yu ........................ | G01N 27/125 73/31.06 |
| 2016/0148633 | A1 | 5/2016 | Hasegawa et al. | |
| 2016/0178569 | A1* | 6/2016 | Hoffman ................ | H10D 62/80 257/29 |
| 2019/0003998 | A1 | 1/2019 | Ellis et al. | |
| 2019/0257732 | A1 | 8/2019 | Gudibande et al. | |
| 2020/0008717 | A1 | 1/2020 | Guy et al. | |
| 2020/0271620 | A1 | 8/2020 | Cheng et al. | |
| 2022/0285496 | A1* | 9/2022 | Chen ...................... | H10D 30/60 |

FOREIGN PATENT DOCUMENTS

| | | | |
|---|---|---|---|
| JP | 2014227304 | A | 12/2014 |
| JP | 2016100038 | A | 5/2016 |
| JP | 2016139492 | A | 8/2016 |
| JP | 2019516452 | A | 6/2019 |
| JP | 2019152511 | A | 9/2019 |
| JP | 2019525200 | A | 9/2019 |
| KR | 101898584 | B1 | 9/2018 |

OTHER PUBLICATIONS

International Search Report in PCT/JP2021/047529, mailed Mar. 8, 2022, 4 pages.

Ma et al., "Investigation of a new graphene strain sensor based on surface plasmon resonance," Scientific Reports, Oct. 2020, vol. 10, No. 16870, pp. 1-8.

Novoselov et al., "Electric Field Effect in Atomically Thin Carbon Films," Science, Oct. 22, 2004, vol. 306, pp. 666-669.

Written Opinion in PCT/JP2021/047529, mailed Mar. 8, 2022, 4 pages.

Yuan et al., "Gold nanoparticles decorated on single layer graphene applied for electrochemical ultrasensitive glucose biosensor," Journal of Electroanalytical Chemistry, 2019, vol. 855, pp. 1-8.

* cited by examiner 40
11

45
40
11

11
41

20
11
41

21
22
11
13

21
22
11
13

FIG. 6A
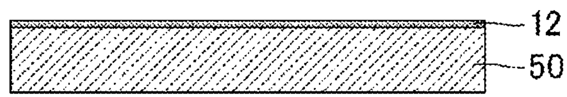
FIG. 6B
FIG. 6C
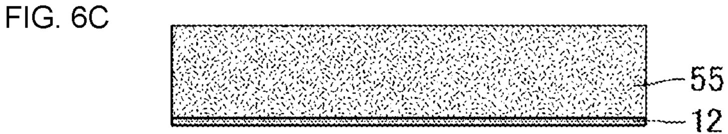
FIG. 6D
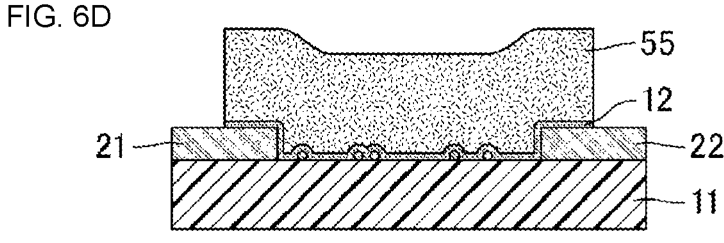
FIG. 6E
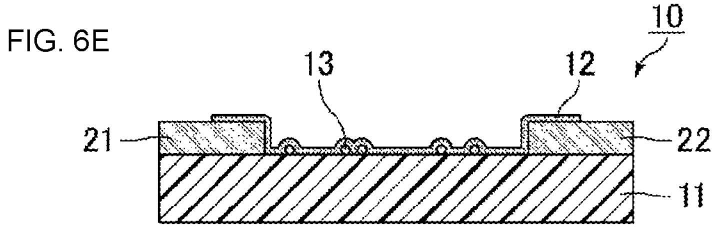

CROSS-SECTIONAL IMAGE
Grey
26
109
25nm

Al DISTRIBUTION
Al K
0
347
25nm

C DISTRIBUTION
C K
145
1123
25nm

Ti DISTRIBUTION
Ti K
0
377
25nm

O DISTRIBUTION
O K
0
694
25nm

Au DISTRIBUTION
Au L
0
375
25nm

STRUCTURE AND FIELD EFFECT TRANSISTOR

CROSS REFERENCE TO RELATED APPLICATIONS

This application claims the benefit of priority to Japanese Patent Application No. 2021-011367 filed on Jan. 27, 2021 and is a Continuation Application of PCT Application No. PCT/JP2021/047529 filed on Dec. 22, 2021. The entire contents of each application are hereby incorporated herein by reference.

BACKGROUND OF THE INVENTION

1. Field of the Invention

The present invention relates to a structure in which a material layer including a two-dimensional material such as graphene or carbon nanotubes is provided on a surface of a substrate. The present invention further relates to a field effect transistor including the structure.

2. Description of the Related Art

Graphene, which is one type of two-dimensional material, has been applied to, for example, field effect transistors, in, for example, Japanese Unexamined Patent Application Publication No. 2019-525200 and Science Vol. 306, pp. 666-669 (2004), biosensors in, for example, Japanese Unexamined Patent Application Publication No. 2019-516452 and Journal of Electroanalytical Chemistry Vol. 855, pp. 113495-1-8 (2019), strain sensors in, for example, Scientific Reports 10, 16870 (2020), transparent conductive films in Japanese Unexamined Patent Application Publication No. 2016-139492, and protective films in, for example, Japanese Unexamined Patent Application Publication No. 2016-100038.

In each of the above documents, a layer containing graphene is disposed on a surface of a substrate. For example, in Japanese Unexamined Patent Application Publication No. 2019-525200, a layer containing a nanoscale material such as graphene is disposed on a surface of an electrically insulating substrate.

However, in all of the above documents, no recognition is made of the adhesion between the layer containing graphene and the substrate. Therefore, the layer containing graphene may easily peel off the substrate.

The above problem is a common problem that occurs not only in the structure in which the layer containing graphene is disposed on the surface of the substrate but also in a structure in which a layer containing a two-dimensional material other than graphene or carbon nanotubes (such layers, including the layer containing graphene, are referred to as material layers) is disposed on the surface of the substrate.

SUMMARY OF THE INVENTION

Preferred embodiments of the present invention provide structures in each of which a material layer is unlikely to peel off the substrate, and field effect transistors each including such structures.

A structure according to a preferred embodiment of the present invention includes a substrate, a material layer on a surface of the substrate and including a two-dimensional material or carbon nanotubes, and particles interposed between the substrate and the material layer.

A field effect transistor according to a preferred embodiment of the present invention includes a structure according to a preferred embodiment of the present invention, a source electrode on a surface of a substrate of the structure and electrically connected to the material layer of the structure, and a drain electrode on the surface of the substrate and spaced apart from the source electrode and that is electrically connected to the material layer.

In each of the structures and field effect transistors according to preferred embodiments of the present invention, the material layer is unlikely to peel off the substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A to 6E are cross-sectional views schematically showing an example of a process for forming a material layer on the surface of the substrate with the electrode pattern formed thereon.

DETAILED DESCRIPTION OF THE PREFERRED EMBODIMENTS

Structures and field effect transistors according to preferred embodiments of the present invention will be described below with reference to the drawings.

However, the present invention is not limited to the following preferred embodiments, and appropriate modifications can be made as long as they do not depart from the spirit of the invention. Combinations of two or more preferred features in the following preferred embodiments of the present invention also fall within the scope of the invention.

Figure 1:
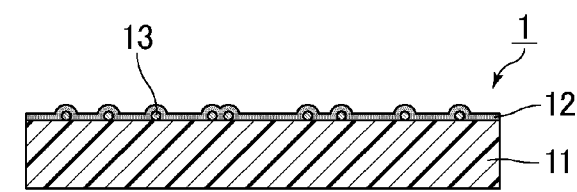
FIG. 1 is a cross-sectional view schematically showing an example of a structure according to a preferred embodiment of the present invention.

FIG. 1 is a cross-sectional view schematically showing an example of a structure according to a preferred embodiment of the invention. The thicknesses of components shown in FIG. 1 are appropriately changed for clarification and simplification of the drawing. The same applies to the other drawings.

The structure 1 shown in FIG. 1 includes a substrate 11, a material layer 12 that is disposed on a surface of the substrate 11 and includes a two-dimensional material or carbon nanotubes, and particles 13 interposed between the substrate 11 and the material layer 12. The material layer 12 may be disposed over the entire or substantially the entire surface of the substrate 11 or may be disposed on a portion of the surface of the substrate 11. The particles 13 may be provided uniformly between the substrate 11 and the material layer 12 or may be concentrated in some portions.

In the structure of the present preferred embodiment, the particles are sandwiched between the substrate and the material layer. Therefore, the contact area of the material layer and its irregularities are larger than those when the particles are not present between the substrate and the material layer. In this case, the adhesion between the material layer and the substrate is improved by the anchor effect, so that the material layer is unlikely to peel off the substrate.

A structure according to a preferred embodiment of the present invention defines and functions as a field effect transistor (FET). When the structure of the present preferred embodiment defines and functions as a field effect transistor, the field effect transistor is preferably used as a sensor such as a biosensor as described later. This field effect transistor including a structure according to a preferred embodiment of the present invention is also included in the present invention.

In the field effect transistor used as, for example, a biosensor, when the material layer including, for example, graphene etc. peels off the substrate, the amount of the material contributing to the response is reduced, and it is feared that the signal to noise ratio (S/N ratio) may decrease. However, in the structure according to the present preferred embodiment, the material layer is unlikely to peel off the substrate, so that the reduction in the signal to noise ratio can be reduced or prevented.

Figure 2:
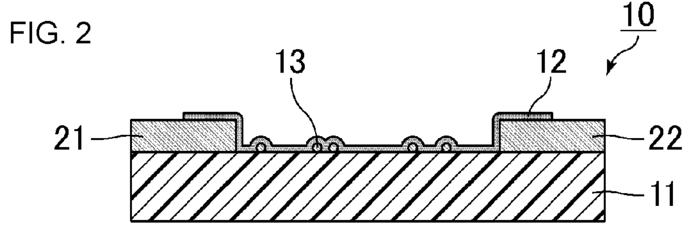
FIG. 2 is a cross-sectional view schematically showing an example of a structure according to a preferred embodiment of the invention.

FIG. 2 is a cross-sectional view schematically showing an example of the structure according to the present preferred embodiment.

Similar to the structure 1 shown in FIG. 1, the structure 10 shown in FIG. 2 includes a substrate 11, a material layer 12 that is disposed on a surface of the substrate 11 and includes a two-dimensional material or carbon nanotubes, and particles 13 interposed between the substrate 11 and the material layer 12. The structure 10 further includes a source electrode 21 disposed on the surface of the substrate 11 and electrically connected to the material layer 12, and a drain electrode 22 that is disposed on the surface of the substrate 11 so as to be spaced apart from the source electrode 21 and that is electrically connected to the material layer 12. The structure 10 thus defines and functions as a field effect transistor.

In the example shown in FIG. 2, the source electrode 21 and the drain electrode 22 are disposed on the surface of the substrate 11 so as to be spaced from each other, and the substrate 11 is exposed in a space between the source electrode 21 and the drain electrode 22. The material layer 12 is disposed on the surface of the substrate 11 so as to cover an end portion of the source electrode 21, the exposed portion of the substrate 11, and an end portion of the drain electrode 22. The material layer 12 present between the source electrode 21 and the drain electrode 22 defines a channel of the field effect transistor.

In the structure of a preferred embodiment of the present invention, the material of the surface of the substrate that is in contact with the material layer is, for example, silicon oxide or aluminum oxide. When the structure defines and functions as the field effect transistor, the substrate used may be an insulating substrate such as, for example, a thermally oxidized silicon substrate prepared by oxidizing a surface of a silicon (Si) substrate to form a silicon oxide ($SiO_2$) layer. No particular limitation is imposed on the material of the insulating substrate, and examples of the material used include inorganic compounds such as silicon oxide, silicon nitride, aluminum oxide, titanium oxide, and calcium fluoride and organic compounds such as acrylic resins, polyimides, and fluorocarbon resins. No particular limitation is imposed on the shape of the insulating substrate, and the insulating substrate may have, for example, a flat shape or a curved shape. The insulating substrate may have flexibility.

In the structure according to the present preferred embodiment, the material layer includes a two-dimensional material or carbon nanotubes, for example. The two-dimensional material is a material whose dimension in the thickness direction is much smaller than the dimensions in plane directions. Specific examples of the two-dimensional material include graphene, molybdenum disulfide, and boron nitride. The number of layers in the material layer is not limited to one, and the material layer may include, for example, two layers or three or more layers. The number of layers in the material layer is preferably, for example, 10 or less and more preferably 5 or less. It is unnecessary that the number of layers is constant over the entire or substantially the entire material layer. For example, portions including one layer and portions including two or more layers may be present. The number of layers in the material layer can be measured, for example, by Raman spectroscopy or by observing a cross section using a transmission electron microscope (TEM). When the material layer includes the two-dimensional material, the two-dimensional material included in the material layer is preferably graphene, for example.

Graphene is a two-dimensional material including carbon atoms bonded together to form a hexagonal net pattern. The specific surface area (the surface area per unit volume) of graphene is very large, and its electrical mobility is very high.

Carbon nanotubes are long tubular carbon compounds. The carbon nanotubes used may be single-wall carbon nanotubes (SW-CNTs) each including one carbon layer having a mesh structure the same as or similar to that of graphene or may be multi-wall carbon nanotubes (MW-CNTs) each including a stack of many carbon layers. Each of these carbon nanotubes have good electric conductivity.

In the structure of the present preferred embodiment, no particular limitation is imposed on the type of particles. Examples of the particles include inorganic particles such as metal particles, ceramic particles, and glass particles; and organic particles such as resin particles.

In particular, the particles are preferably, for example, metal particles and more preferably metal particles including at least one metal element selected from the group consisting of gold, platinum, and titanium. The interaction between these metal particles and the material layer allows the material layer to resist peeling off the substrate.

In the structure of the present preferred embodiment, no particular limitation is imposed on the diameter of the particles. However, if the particle diameter is excessively large, the contribution of the characteristics of the particles to the characteristics (such as electrical characteristics or optical characteristics) of a device including the structure of the present preferred embodiment is large, and the contribution of the characteristics of the material layer decreases in a relative sense, so that the operation of the device may be adversely affected. It is therefore preferable that the particles are nanoparticles. Specifically, the diameter of the particles is preferably, for example, from about 1 nm to about 10 nm inclusive.

The diameters of the particles mean the diameters of the particles observed when the surface of the substrate with the material layer disposed thereon is analyzed using a scanning electron microscope (SEM) under the observation conditions described later in Examples. The maximum length of a straight line connecting two points on the outer circumference of a particle is defined as the diameter of the particle.

In the structure of the present preferred embodiment, no particular limitation is imposed on the in-plane number density of the particles. However, if the in-plane number density is excessively high, the contribution of the characteristics of the particles to the characteristics (such as electrical characteristics or optical characteristics) of a device including the structure is large, and the contribution of the characteristics of the material layer decreases in a relative sense, so that the operation of the device may be adversely affected. Therefore, the in-plane number density of the particles is preferably, for example, from about 833/μm$^2$ to about 1740/μm$^2$ inclusive.

The in-plane number density of the particles can be determined by counting the number of particles in viewing fields (each viewing field has dimensions of, for example, about 423 nm×about 318 nm) observed when the surface of the substrate with the material layer disposed thereon is analyzed using a scanning electron microscope (SEM) under the observation conditions described later in Examples.

When the structure of the present preferred embodiment defines and functions as the field effect transistor, the source electrode and the drain electrode are each, for example, an electrode having a multilayer structure including a titanium (Ti) layer and a gold (Au) layer stacked together. In addition to titanium and gold, a single layer of a metal such as, for example, gold, platinum, titanium, or palladium may be used as an electrode material, and a multilayer structure composed of a combination of two or more metals may also be used.

When the structure of the present preferred embodiment defines and functions as the field effect transistor, the structure may further include a gate electrode for applying an electric field to the material layer from the outside.

When the structure of the present preferred embodiment defines and functions as the field effect transistor, the structure may further include a receptor attached to a surface of the material layer that is on an opposite side from the substrate. In this case, the structure can be preferably used as a sensor such as, for example, a biosensor for specifically detecting a detection target material. Examples of the receptor include antibodies, antigens, saccharides, aptamers, and peptides. It is unnecessary that the receptor is attached directly to the surface of the material layer, and the receptor may be bonded to the material layer with, for example, a linker interposed therebetween.

When the structure of the present preferred embodiment is used as the biosensor, specific examples of the detection target material include cells, microorganisms, viruses, proteins, enzymes, nucleic acids, and low-molecular weight biological materials.

When the structure of the present preferred embodiment is used as the biosensor, the field effect transistor is operable in, for example, liquid. In this case, the surface of the structure that is in contact with the liquid has sites bondable to the detection target material. In the biosensor used in liquid, a force caused by the flow of the liquid acts on the material layer. Therefore, when the adhesion between the substrate and the material layer is low, noise may increase. In the structure, since the material layer is unlikely to peel off the substrate, noise during the operation of the sensor in liquid can be reduced or prevented.

Figure 3:
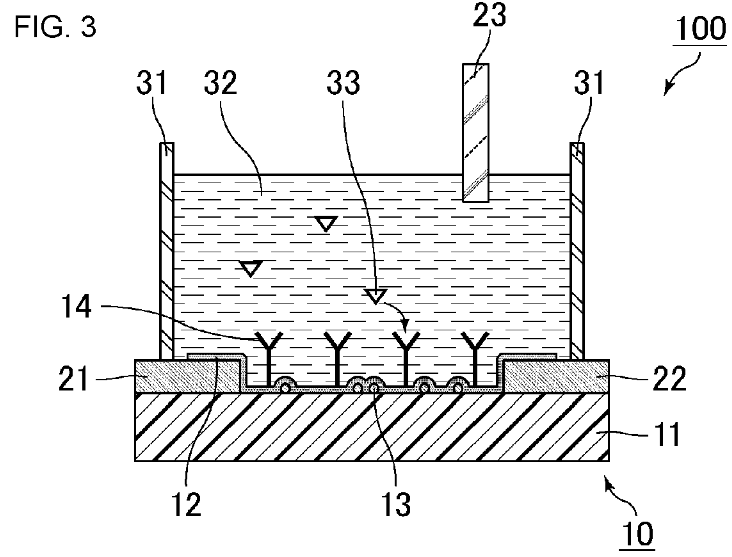
FIG. 3 is a schematic illustration showing an example of the configuration of a biosensor including a structure according to a preferred embodiment of the invention.

FIG. 3 is an illustration schematically showing an example of the configuration of a biosensor including the structure of the present preferred embodiment.

The biosensor 100 shown in FIG. 3 includes the structure 10 shown in FIG. 2. A receptor 14 is attached to a surface of the material layer 12 that is on a side opposite from the substrate 11. The biosensor 100 is formed by mounting, for example, a silicone rubber-made pool 31 on the structure 10, filling the pool 31 with an electrolyte 32, immersing a gate electrode 23 into the electrolyte 32, and connecting a bipotentiostat (not shown) to the source electrode 21, the drain electrode 22, and the gate electrode 23. The electrolyte 32 includes a detection target material 33.

The gate electrode 23 is used to apply a potential to the source electrode 21 and the drain electrode 22, and a noble metal is generally used for the gate electrode 23. The gate electrode 23 is disposed at a position other than the formation positions of the source electrode 21 and the drain electrode 22. Generally, the gate electrode 23 is disposed on the substrate 11 or at a position other than a position on the substrate 11. Preferably, the gate electrode 23 is disposed above the source electrode 21 or the drain electrode 22.

Figure 4:
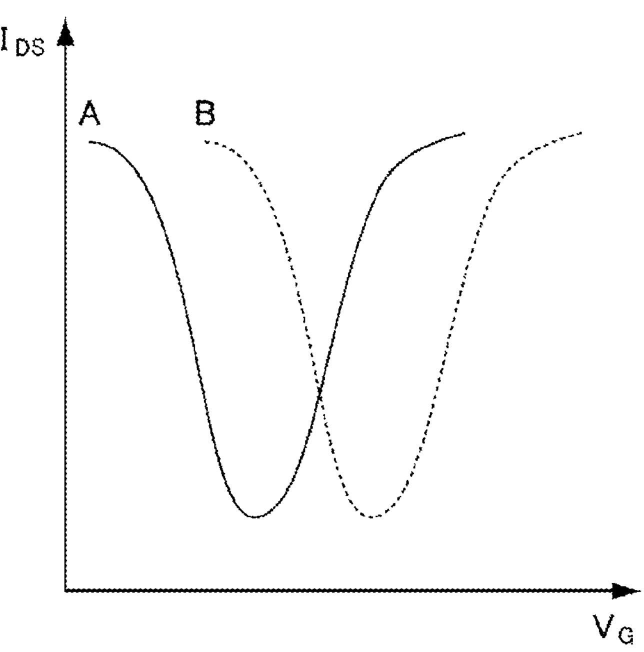
FIG. 4 is a graph showing the relation between a gate voltage $V_G$ and a source-drain current $I_{DS}$.

FIG. 4 is a graph showing the relationship between a gate voltage $V_G$ and a source-drain current $I_{DS}$.

In FIG. 4, the source-drain current $I_{DS}$ when the receptor is not bonded to the detection target material is represented by a solid line A, and the source-drain current $I_{DS}$ when the receptor is bonded to the detection target material is represented by a broken line B. As shown in FIG. 4, when the receptor is specifically bonded to the detection target material, the conduction characteristics are modulated by charges on target molecules, i.e., the detection target material. By observing the modulation, the presence or absence of the detection target material or its concentration can be sensed.

A non-limiting example of a method for producing the structure 10 shown in FIG. 2 will be described.

First, a general photolithography process is used to form an electrode pattern on a surface of a substrate.

FIGS. 5A to 5F are cross-sectional views schematically showing an example of the process for forming the electrode pattern on the surface of the substrate.

Figures 5A, 5B, 5C, 5D, 5E, 5F:
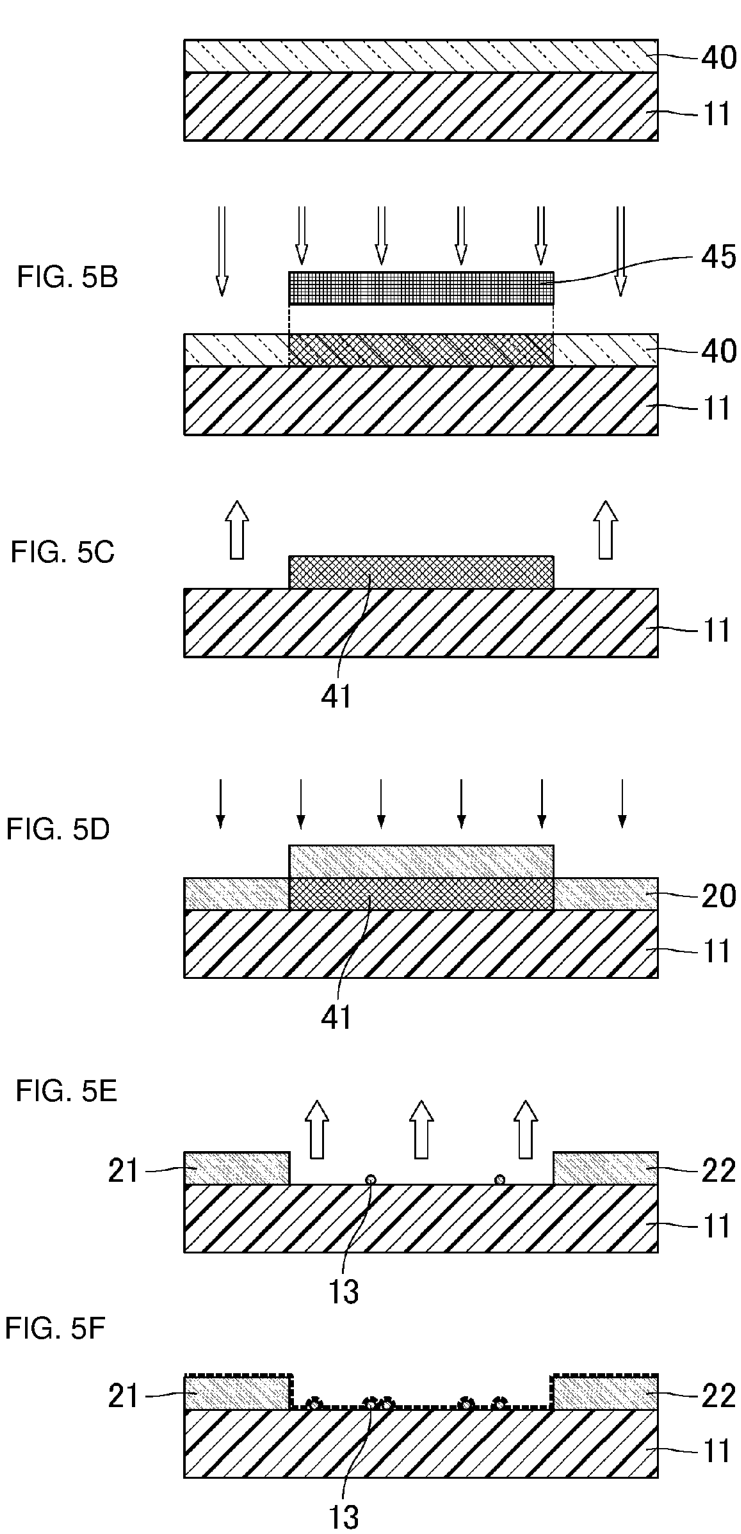
FIGS. 5A to 5F are cross-sectional views schematically showing an example of a process for forming an electrode pattern on a surface of a substrate.

As shown in FIG. 5A, a resist 40 is applied to the surface of the substrate 11.

As shown in FIG. 5B, a mask 45 is disposed such that a portion of the resist 40 overlapping the mask 45 is shielded from light, and then the resist 40 is exposed to light.

As shown in FIG. 5C, the exposed portions are removed by development to form a resist image 41.

As shown in FIG. 5D, an electrode material 20 is vapor-deposited on the exposed portions of the substrate 11 and on the resist image 41.

As shown in FIG. 5E, ultrasonic cleaning is used to perform lift-off to remove the resist image 41 and the electrode material 20 deposited thereon. It is inferred that, during the ultrasonic cleaning performed for the lift-off shown in FIG. 5E, the removed electrode material 20 is finely pulverized and then re-deposited on the surface of the substrate 11 as particles 13 that are metal particles.

As shown in FIG. 5F, it is preferable to perform surface modification using, for example, an oxygen plasma. It is inferred that the oxygen plasm used for the surface modification shown in FIG. 5F causes a portion of the evaporated electrode material 20 to be re-deposited on the surface of the substrate 11 as particles 13 that are metal particles.

The in-plane number density of the particles can be controlled by changing the conditions for the lift-off or surface modification. For example, by increasing the output power for the surface modification or by increasing the surface modification time, the in-plane number density of the particles can be increased.

Through the above example process, the source electrode 21 and the drain electrode 22, for example, are formed on the surface of the substrate 11 as an electrode pattern.

Next, a material layer including a two-dimensional material or carbon nanotubes is formed on the surface of the substrate with the electrode pattern formed thereon. For example, the two-dimensional material or the carbon nanotubes are transferred onto the surface of the substrate with the electrode pattern formed thereon.

FIGS. 6A to 6E are cross-sectional views schematically showing an example of a process for forming the material layer on the surface of the substrate with the electrode pattern formed thereon.

As shown in FIG. 6A, the material layer 12 deposited on a copper foil 50 is prepared.

As shown in FIG. 6B, a transfer medium 55 is applied to the material layer 12.

As shown in FIG. 6C, the copper foil 50 is removed.

As shown in FIG. 6D, the material layer 12 is transferred onto the surface of the substrate 11 on which the source electrode 21 and the drain electrode 22 have been formed as the electrode pattern. Since the material layer 12 and the transfer medium 55 are flexible, the material layer 12 and the transfer medium 55 are deformed along the shape of the surface of the substrate 11 on which the source electrode 21 and the drain electrode 22 have been formed and are thus transferred on the surface of the substrate 11 as shown in FIG. 6D.

As shown in FIG. 6E, the transfer medium 55 is removed.

Through the above example process, the structure 10 shown in FIG. 2 is obtained.

EXAMPLES

An Example that describes a structure of a preferred embodiment of the present invention in more detail will be described below. However, the present invention is not limited only to the Example.

In the present Example, the structure 10 shown in FIG. 2 was produced through the steps shown in FIGS. 5A to 5F and FIGS. 6A to 6E.

In the step shown in FIG. 5A, a Si wafer substrate (commercial product) having a thermally oxidized film with a thickness of about 290 nm on its surface was prepared as the substrate 11.

In the step shown in FIG. 5D, for example, an electron beam vapor deposition device was used to deposit titanium (Ti) used as an electrode material 20 to a thickness of about 10 nm and then gold (Au) used as another electrode material 20 to a thickness of about 90 nm, for example.

In the step of performing the lift-off shown in FIG. 5E, an ultrasonic cleaner (UT-206 manufactured by Sharp Corporation) was used to remove the resist image 41 and the electrode materials 20 (metal materials) thereon and perform ultrasonic cleaning in acetone for about 5 minutes. Then ultrasonic cleaning is performed in fresh acetone for about 15 minutes and then further performed in ultrapure water for about 5 minutes, for example.

In the step of performing the surface modification shown in FIG. 5F, a reactive ion etching device (RIE-10NR manufactured by Samco Inc.) was used to preform surface treatment at a power of about 300 W in oxygen at about 100 Pa for about 4 minutes, for example.

In the step shown in FIG. 6A, graphene (a commercial product) was prepared as the material layer 12 deposited on the copper foil 50.

In the step shown in FIG. 6B, for example, a polymethyl methacrylate resin (polymethyl methacrylate: PMMA) used as the transfer medium 55 was applied by, for example, spin coating to the material layer 12 (graphene) deposited on the copper foil 50 and was then heated on a hot player to cure the PMMA.

In the step shown in FIG. 6C, the copper foil 50 was dissolved and removed using a chemical solvent, and the resulting product was rinsed with ultrapure water.

In the step shown in FIG. 6D, the PMMA/graphene sheet floating on ultrapure water was transferred onto the substrate 11 (base substrate) with the electrode pattern for the source electrode 21 and the drain electrode 22 formed thereon and was then heated and dried on, for example, a hot plate.

In the step shown in FIG. 6E, the transfer medium 55 (PMMA) was dissolved and removed using an organic solvent, and the resulting product was rinsed with ultrapure water.

For the structure in the Example, the surface of the substrate after the lift-off shown in FIG. 5E but before the surface modification shown in FIG. 5F and the surface of the substrate after the surface modification shown in FIG. 5F but before the transfer of graphene shown in FIG. 6D were analyzed using an atomic force microscope (AFM). The AFM used was Dimension-Fastscan manufactured by Bruker Japan K.K., and each substrate surface was observed using a tapping mode.

Figure 7A:
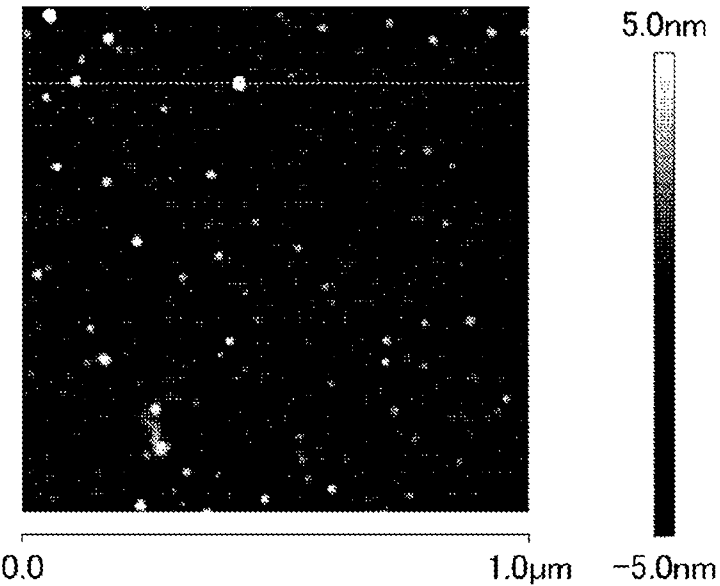
FIG. 7A shows an AFM image of a substrate surface after lift-off but before surface modification.
Figure 7B:
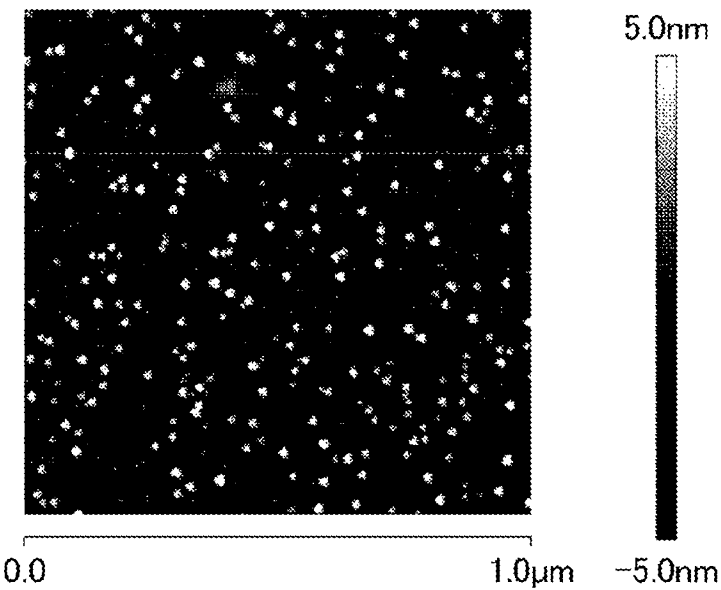
FIG. 7B shows an AFM image of the substrate surface after the surface modification but before transfer of graphene.

FIG. 7A shows the AFM image of the substrate surface after the lift-off but before the surface modification. FIG. 7B shows the AFM image of the substrate surface after the surface modification but before the transfer of graphene.

As shown in FIGS. 7A and 7B, nanoparticles with a height a little less than, for example, about 10 nm were observed. The amount of the nanoparticles in FIG. 7B was larger than that in FIG. 7A. It is inferred that the nanoparticles observed in FIG. 7A are metal particles adhering to the substrate surface as a result of the ultrasonic cleaning during the lift-off. It is inferred that the nanoparticles observed in FIG. 7B include, in addition to the metal particles adhering to the substrate surface as a result of the ultrasonic cleaning during the lift-off, metal particles caused to adhere to the substrate surface by the oxygen plasma during the surface modification.

For the structure in the Example, the substrate surface after the lift-off shown in FIG. 5E but before the surface modification shown in FIG. 5F and the substrate surface after the surface modification shown in FIG. 5F but before the transfer of graphene shown in FIG. 6D were analyzed by X-ray photoelectron spectroscopy (XPS). The XPS apparatus used was VersaProbe manufactured by ULVAC-PHI, Inc., and a Φ50 μm region between the electrodes was irradiated with X-rays to observe the spectrum of the substrate surface.

Figure 8A:
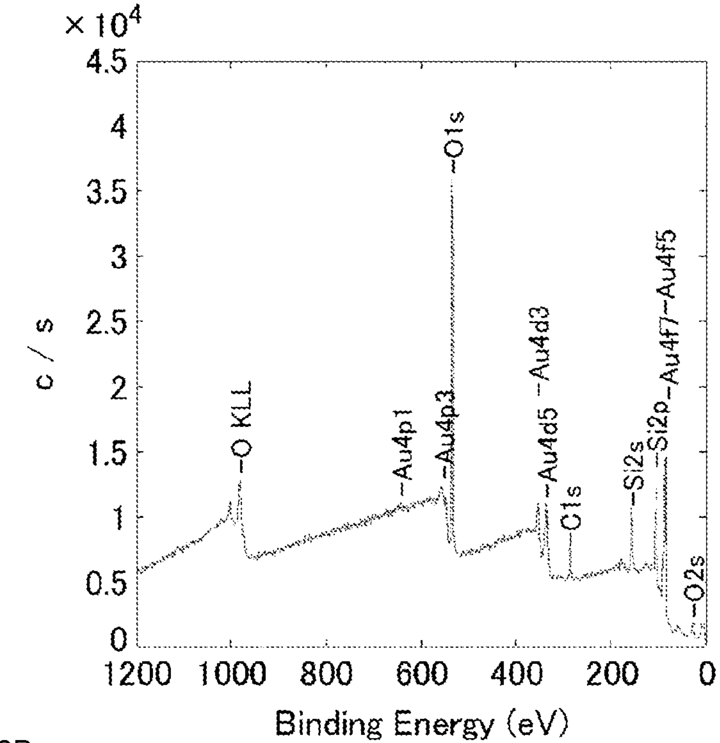
FIG. 8A shows an XPS spectrum of the substrate surface after the lift-off but before the surface modification.
Figure 8B:
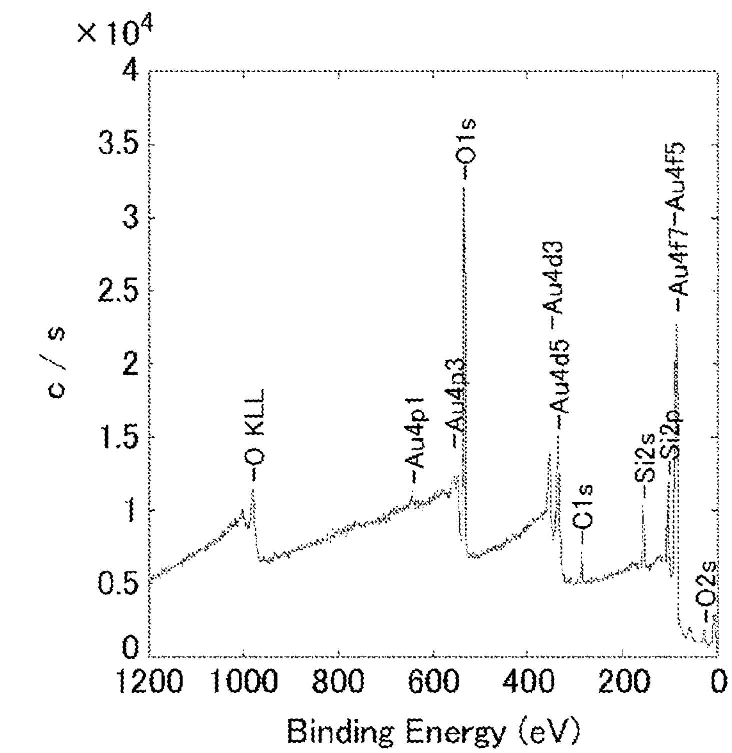
FIG. 8B shows an XPS spectrum of the substrate surface after the surface modification but before the transfer of graphene.

FIG. 8A shows the XPS spectrum of the substrate surface after the lift-off but before the surface modification. FIG. 8B shows the XPS spectrum of the substrate surface after the surface modification but before the transfer of graphene.

As shown in FIGS. 8A and 8B, signals of gold (Au) were observed also in the region between the electrodes, and the intensities of the signals in FIG. 8B were higher than those in FIG. 8A.

The AFM analysis and the XPS analysis show that the nanoparticles are present on the substrate surface and that gold is present also in the region with no electrodes formed thereon. By combining the AFM analysis and the XPS analysis with scanning electron microscope (SEM) analysis and transmission electron microscope (TEM) analysis described later, it is inferred that these particles correspond to gold nanoparticles. It is also inferred that these particles are formed by re-adhesion of the electrode material removed as a result of the ultrasonic cleaning during the lift-off and re-adhesion of the electrode material evaporated in the oxygen plasma during the surface modification.

For the structure in the Example, its surface after the transfer of graphene shown in FIG. 6E was analyzed using a scanning electron microscope (SEM). The SEM used was Regulus 8230 manufactured by Hitachi High-Tech Corporation. The observation conditions were an acceleration voltage of about 3 kV, an emission current of about 10 ρA, a working distance of about 2 mm, a magnification of about 300 kX (300000×), and an imaging area of about 423 nm×318 nm (0.1345 $\mu m^2$), and an reflection electron image was taken.

Figure 9:
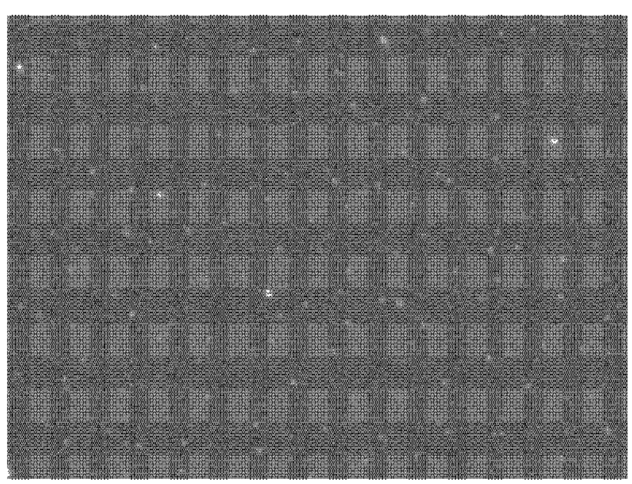
FIG. 9 shows an SEM image of the surface after the transfer of graphene.

FIG. 9 shows an SEM image of the surface after the transfer of graphene.

As shown in FIG. 9, bright spots of about 1 nm to a little less than about 10 nm were observed. One feature of the reflection electron image is that the heavier the element of a material, the brighter the material. Therefore, by combining the XPS analysis described above with the TEM analysis described later, it is inferred that these bright spots correspond to the presence of gold, i.e., gold nanoparticles were observed.

For the structure in the Example, SEM images the same as or similar to the above SEM image were taken at a plurality of portions, and the number of bright spots was counted in each of the viewing fields and divided by the imaging area (0.1345 $\mu m^2$). The in-plane number density of the nanoparticles was thereby determined, and variations in the in-plane number density were evaluated. The results are shown in Table 1.

TABLE 1

| Viewing field | Number of bright spots | In-plane number density [/$\mu m^2$] |
|---|---|---|
| 1 | 215 | 1600 |
| 2 | 234 | 1740 |
| 3 | 112 | 833 |
| 4 | 156 | 1160 |
| 5 | 155 | 1150 |
| | Average | 1297 |
| | Standard deviation | 329 |

An electron beam vapor deposition device was used to deposit about 0.8 nm of titanium on the structure in the Example after the transfer of graphene, and then an atomic layer deposition device was used to deposit about 2.5 nm of aluminum oxide. A cross section of the resulting structure was analyzed by transmission electron microscopy (TEM)-energy dispersive X-ray spectroscopy (EDX). The TEM used was JEM-F200 manufactured by JEOL Ltd., and the acceleration voltage was about 200 kV. The EDX used was NORAN system 7 manufactured by Thermo Fisher Scientific K.K.

FIGS. 10A to 10F show TEM-EDX images of the structure in the Example.

Figures 10A, 10B, 10C, 10D, 10E, 10F:
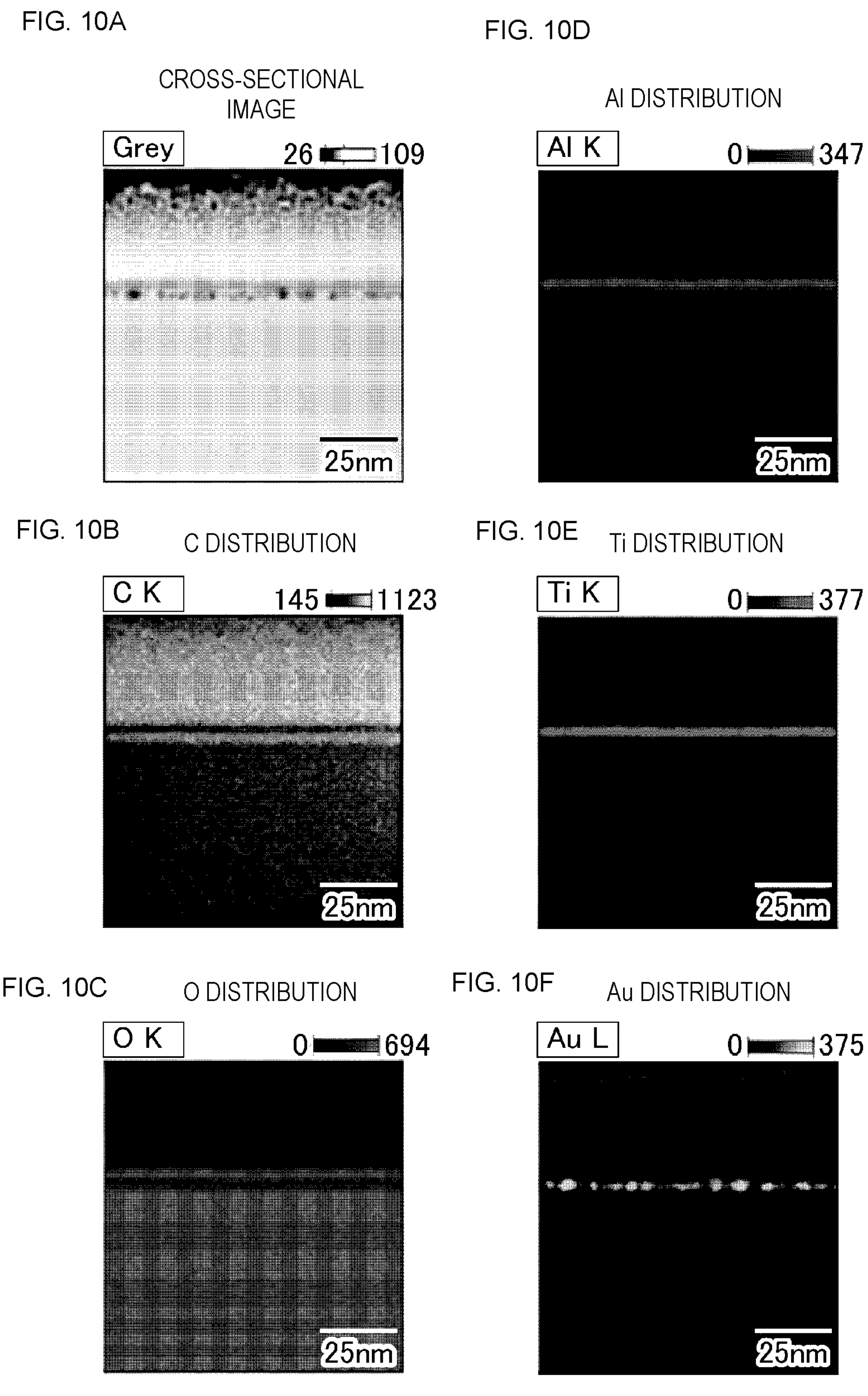
FIGS. 10A to 10F show TEM-EDX images of a structure in an Example.

As shown in FIGS. 10A to 10F, gold is distributed discontinuously above the substrate but below the graphene layer (see C distribution in FIG. 10B). In the observation, no elements other than gold were distributed discontinuously. Therefore, it is inferred that the element of the nanoparticles observed in the AFM analysis and the SEM analysis described above is gold.

To check the adhesion improving effect of the gold nanoparticles, the surface of the structure in the Example after the transfer of graphene was observed under an optical microscope to evaluate the degree of peeling of graphene. If the adhesion is low, the force applied during removal of the PMMA and washing causes the graphene to peel off.

Figure 11:
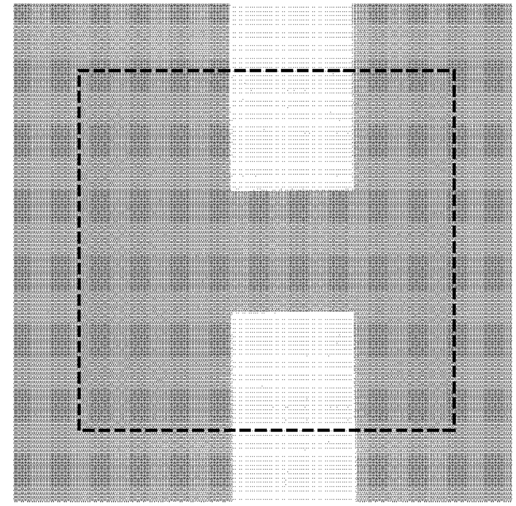
FIG. 11 shows an optical microscope image of a surface of a structure in an Example according to a preferred embodiment of the invention.

FIG. 11 shows an optical microscope image of the surface of the structure in the Example. In FIG. 11, the graphene is transferred onto a region surrounded by a broken line.

As shown in FIG. 11, in the structure in the Example, almost no peeling of the transferred graphene is found, and almost 100% of the graphene remains present.

In a Comparative Example, no electrodes were provided, and graphene was transferred onto a substrate with no gold nanoparticles present thereon. Then the degree of peeling of the graphene was evaluated using an optical microscope in the same or substantially the same manner as described above.

Figure 12:
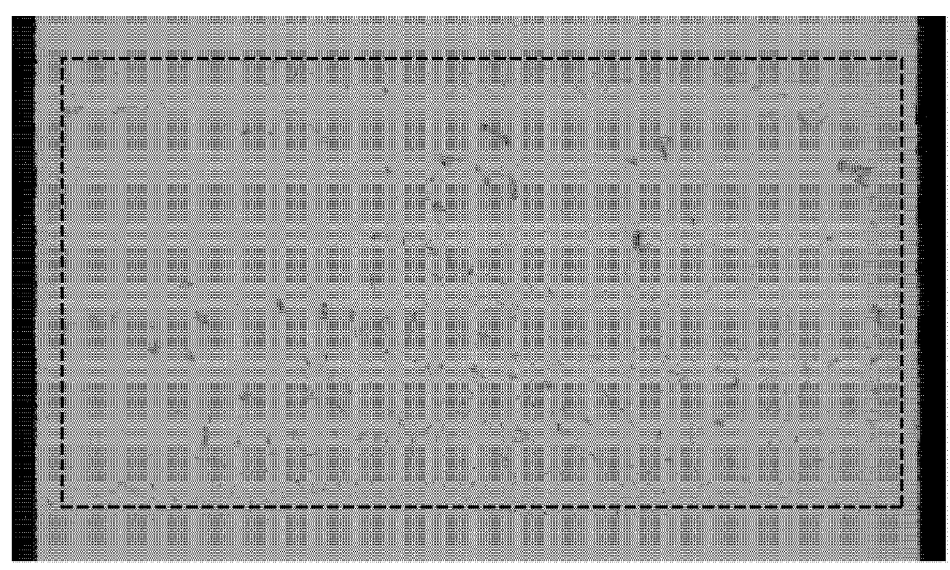
FIG. 12 shows an optical microscope image of a surface of a structure in a Comparative Example.

FIG. 12 shows an optical microscope image of the surface of the structure in the Comparative Example. In FIG. 12, the graphene is transferred onto a region surrounded by a broken line.

As shown in FIG. 12, in the structure in the Comparative Example, a large amount of the transferred graphene was peeled off.

As can be seen from the above results, when particles such as, for example, gold nanoparticles are present between the substrate such as the base substrate and the material layer including graphene etc., the material layer is unlikely to peel off the substrate.

In the above Example, it is inferred that the gold nanoparticles are formed by re-adhesion of the electrode material removed as a result of the ultrasonic cleaning during the lift-off and re-adhesion of the electrode material evaporated in the oxygen plasma during the surface modification. However, in addition to the gold nanoparticles, titanium nanoparticles may be formed.

The structure of the present invention is not limited to the above-described preferred embodiments, and the configuration of the structure and its production conditions, etc. can be used for various applications and modified within the scope of the invention.

It is unnecessary that the structure includes the electrodes such as the source electrode and the drain electrode as long as the structure includes the substrate, the material layer, and the particles.

For example, when the structure includes a material layer including graphene, examples of the application of the graphene with no electrodes provided include the above-described strain sensors (Scientific Reports 10, 16870

(2020)), the above-described transparent conductive films (Japanese Unexamined Patent Application Publication No. 2016-139492), and the above-described protective films (Japanese Unexamined Patent Application Publication No. 2016-100038).

In the strain sensors, the light transmitting properties of graphene are utilized. Since the light transmittance of graphene is changed under the application of strain, light can be used to detect the strain. Since the optical response is observed in the strain sensors as described above, the electrodes are unnecessary. When the structure of the invention is used as a strain sensor, a polymer such as, for example, polydimethylsiloxane (PDMS) may be used for the substrate.

Since the material layer is unlikely to peel off the substrate, even when a structure of a preferred embodiment is used as a strain sensor, a reduction in the signal to noise ratio can be reduced or prevented as in the case where the structure is used as a field effect transistor.

In a transparent conductive film, the characteristics of graphene such as high electrical conductivity and high bending resistance that are obtained even when the graphene is thin enough for light to pass therethrough are utilized. When a structure of a preferred embodiment is used as a transparent conductive film, a resin film such as, for example, a polyethylene terephthalate (PET) film may be used as the substrate.

In a transparent conductive film, it is feared that, if the material layer peels off the substrate, the conductivity may decrease. However, in the structure of preferred embodiments, since the material layer is unlikely to peel off the substrate, the reduction in electric conductivity can be reduced or prevented.

Structures of preferred embodiments of the present invention can be used also as a protective film for magnetic recording materials etc. while the corrosion resistance and wear resistance of graphene are utilized. When the structure is used as a protective film for a magnetic recording material, the substrate may be, for example, a magnetic layer.

In a protective film, it is feared that, if the material layer peels off the substrate, the protective function will not be obtained in the peeled portion. However, in structures of preferred embodiments of the present invention, since the material layer is unlikely to peel off the substrate, the reduction in the protective function can be reduced or prevented.

When a structure of a preferred embodiment of the present invention includes no electrodes, the structure can be produced by dispersing particles such as, for example, gold nanoparticles between the substrate and the material layer. For example, an electrostatic spraying method may be used to apply a commercial dispersion of gold nanoparticles to the substrate, and then the material layer may be formed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A field effect transistor comprising:

a substrate;

a material layer on a surface of the substrate and including a two-dimensional material or carbon nanotubes;

particles interposed between the substrate and the material layer;

a source electrode on the surface of the substrate and electrically connected to the material layer; and a drain electrode on the surface of the substrate and spaced apart from the source electrode electrically connected to the material layer; wherein at least some of the particles are directly on the substrate.

2. The field effect transistor according to claim 1, wherein the particles are metal particles.

3. The field effect transistor according to claim 1, wherein the particles are metal particles including at least one of gold, platinum, or titanium.

4. The field effect transistor according to claim 1, wherein the particles have a particle diameter of about 1 nm to about 10 nm inclusive.

5. The field effect transistor according to claim 1, wherein the particles have an in-plane number density of about $833/\mu m^2$ to about $1740/\mu m^2$ inclusive.

6. The field effect transistor according to claim 1, wherein the material layer includes the two-dimensional material, and the two-dimensional material is graphene.

7. The field effect transistor according to claim 1, wherein the surface of the substrate in contact with the material layer includes silicon oxide or aluminum oxide.

8. The field effect transistor according to claim 1, further comprising a gate electrode to apply an electric field to the material layer from outside.

9. The field effect transistor according to claim 1, wherein the field effect transistor is operable in liquid.

10. The field effect transistor according to claim 1, wherein the substrate includes an exposed portion in a space between the source electrode and the drain electrode.

11. The field effect transistor according to claim 10, wherein the material layer covers an end portion of the source electrode, the exposed portion of the substrate, and an end portion of the drain electrode.

12. The field effect transistor according to claim 1, wherein the substrate is a thermally oxidized silicon substrate.

13. The field effect transistor according to claim 1, wherein the substrate includes at least one of silicon oxide, silicon nitride, aluminum oxide, titanium oxide, calcium fluoride, acrylic resins, polyimides, or fluorocarbon resins.

14. The field effect transistor according to claim 1, wherein the material layer includes 10 or less layers.

15. The field effect transistor according to claim 1, wherein the material layer includes five or less than five layers.

16. The field effect transistor according to claim 1, wherein the particles includes at least one of metal particles, ceramic particles, glass particles, or resin particles.

17. The field effect transistor according to claim 1, wherein the particles include at least one of gold, platinum, or titanium.

18. The field effect transistor according to claim 1, wherein each of the source electrode and the drain electrode has a multilayer structure including titanium and gold.

19. The field effect transistor according to claim 1, wherein each of the source electrode and the drain electrode includes a single layer including gold, platinum, titanium, or palladium.

20. The field effect transistor according to claim 1, wherein at least a portion of the material layer is directly on the surface of the substrate.

* * * * *